US 8,937,628 B2

(12) United States Patent
Hatcher et al.

(10) Patent No.: US 8,937,628 B2
(45) Date of Patent: Jan. 20, 2015

(54) MAPPING OF A CONTOUR SHAPE TO AN X AND Y COORDINATE SYSTEM

(75) Inventors: Clifford Hatcher, Orlando, FL (US);
Yakup Genc, Dayton, NJ (US); Sajjad Hussain Baloch, Monmouth Junction, NJ (US)

(73) Assignee: Siemens Energy, Inc., Orlando, FL (US)

( * ) Notice: Subject to any disclaimer, the term of this patent is extended or adjusted under 35 U.S.C. 154(b) by 177 days.

(21) Appl. No.: 13/494,065

(22) Filed: Jun. 12, 2012

(65) Prior Publication Data
US 2012/0327124 A1    Dec. 27, 2012

Related U.S. Application Data

(60) Provisional application No. 61/499,315, filed on Jun. 21, 2011.

(51) Int. Cl.
| G09G 5/00 | (2006.01) |
| G06F 17/50 | (2006.01) |
| G06T 7/00 | (2006.01) |
| G06T 7/60 | (2006.01) |
| G01C 11/00 | (2006.01) |
| G06F 3/042 | (2006.01) |
| G06T 11/00 | (2006.01) |

(52) U.S. Cl.
CPC ............. *G06F 17/50* (2013.01); *G06T 7/0042* (2013.01); *G06T 7/60* (2013.01); *G01C 11/00* (2013.01); *G06F 3/0425* (2013.01); *G06T 7/00* (2013.01); *G06T 11/003* (2013.01); *G06F 17/5095* (2013.01); *G06T 2207/10004* (2013.01); *G06T 2207/30164* (2013.01); *G06T 2207/30208* (2013.01)

USPC ........... 345/619; 345/419; 345/581; 345/629; 382/108; 382/203

(58) Field of Classification Search
CPC ......... G06T 11/60; G06T 19/00; G06T 11/00; G06F 9/44458; G06F 3/0481
USPC ........... 345/419, 581, 619, 629; 382/108, 203
See application file for complete search history.

(56) References Cited

U.S. PATENT DOCUMENTS

| 2,973,582 A * | 3/1961 | Price .................................. 33/546 |
| 5,898,438 A | 4/1999 | Stewart |
| 6,044,132 A | 3/2000 | Navab |
| 7,046,839 B1 | 5/2006 | Richer |
| 7,110,591 B2 | 9/2006 | Neubauer |

(Continued)

FOREIGN PATENT DOCUMENTS

EP        0088503 A2    9/1983

*Primary Examiner* — Xiao Wu
*Assistant Examiner* — Todd Buttram (57) ABSTRACT

A method for determining geometric properties of a target shape such as a shape of a perimeter of a strut shield (36) for use in a gas turbine (10). The method includes obtaining a digital image of at least a portion of a first object including a first feature (164) (106). The image including the first feature (164) is displayed on a display device (108). During a reconstruction process, one or more control points (168A, 168B, 168C, 168D) are associated with feature points (164A, 164B, 164C) along an extent of the displayed first feature (164) (109). Using the associated one or more control points (168A, 168B, 168C and 168D), a data file is created that corresponds to the first feature (164) (114). The data file includes geometric properties of the feature points (164A, 164B, 164C).

17 Claims, 4 Drawing Sheets

(56) References Cited

U.S. PATENT DOCUMENTS

| | | |
|---|---|---|
| 7,602,404 B1 | 10/2009 | Reinhardt |
| 7,657,065 B2 | 2/2010 | Kotake |
| 7,986,825 B2 | 7/2011 | Kochi |
| 8,477,154 B2* | 7/2013 | Davis et al. ............ 345/653 |
| 2002/0128790 A1* | 9/2002 | Woodmansee ............ 702/81 |
| 2005/0232767 A1* | 10/2005 | Holder ............ 416/61 |
| 2006/0126902 A1* | 6/2006 | Matsuda et al. ............ 382/108 |
| 2007/0098234 A1* | 5/2007 | Fiala ............ 382/120 |
| 2009/0092278 A1* | 4/2009 | Doi et al. ............ 382/100 |
| 2009/0324093 A1* | 12/2009 | Miarecki et al. ............ 382/203 |
| 2010/0017178 A1 | 1/2010 | Tsuk |
| 2010/0110074 A1 | 5/2010 | Pershing |
| 2011/0001973 A1* | 1/2011 | Polidor et al. ............ 356/393 |
| 2011/0026805 A1* | 2/2011 | Hori ............ 382/141 |
| 2011/0090343 A1* | 4/2011 | Alt et al. ............ 348/164 |
| 2011/0261165 A1 | 10/2011 | Kochi |
| 2012/0194505 A1* | 8/2012 | Beck ............ 345/419 |

* cited by examiner

MAPPING OF A CONTOUR SHAPE TO AN X AND Y COORDINATE SYSTEM

This application claims benefit of the 21 Jun. 2011 filing date of U.S. provisional patent application No. 61/499,315, which is incorporated by reference herein.

FIELD OF THE INVENTION

This invention relates generally to gas turbines and more specifically to a method and apparatus for mapping a gas turbine strut shield contour shape to an X-Y coordinate system for use in fabricating a replacement strut shield.

BACKGROUND OF THE INVENTION

A gas turbine, also called a combustion turbine, is a type of internal combustion engine including a rotating compressor coupled to a turbine. Ignition of a fuel in a combustion chamber disposed between the compressor and the turbine creates a high-pressure and high-velocity gas flow. The gas flow is directed to the turbine, causing it to rotate.

The combustion chamber comprises a ring of fuel injectors that direct fuel (typically kerosene, jet fuel, propane or natural gas) into the compressed air stream to ignite the air/fuel mixture. Ignition increases both the temperature and pressure of the air/fuel mixture (also referred to as a working gas).

The working gas expands as it passes through the turbine. The turbine includes rows of stationary guide vanes and rotating turbine blades connected to a turbine shaft. The expanding gas flow is accelerated by the guide vanes and also directed over the rotating turbine blades, causing the blades and the turbine shaft to spin. The spinning shaft both turns the compressor and provides a mechanical output. Energy can be extracted from the turbine in the form of shaft power, compressed air, thrust or any combination of these, for use in powering aircraft, trains, ships and electric generators.

After passing through the turbine section, the working gas flow enters a turbine exhaust case through a nozzle. Inner and outer walls of a conventional exhaust case nozzle include respective inner and outer annular rings, which are typically formed as single piece castings. The exhaust gases pass between the inner and outer rings.

Loads are transferred between the inner and outer walls through a series of radial struts disposed within the exhaust gas flow path. Each strut is encapsulated in an aerodynamic fairing shield. The cross-section of a shield resembles an airplane wing with a rounded leading edge tapering to a thinner trailing edge.

Different rates of thermal expansion between the inner and outer rings cause significant thermal stresses to develop within the strut shields and at the point of connection between the strut shield and the inner and outer rings as hot exhaust gasses flow through this region. These thermal stresses can lead to cracking and fatigue degradation of the strut shields, especially where the shields are joined to the inner and outer annular rings.

One approach to minimize the thermal stresses increases the width of the strut shields; wider strut shields exhibit lower thermal transients, thereby minimizing temperature gradients across the shield. Wider strut shields are also capable of supporting larger loads than thinner shields. However, increasing the strut shield width correspondingly increases the blockage of gas flow in the nozzle gas flow path, which may lead to increased disruption of air flow and a corresponding reduction in gas turbine efficiency.

Thus, there remains a need for further contributions in the area of nozzle technology, especially as related to thermal cracking of the strut shields. The present invention satisfies this need in a novel and non-obvious way.

BRIEF DESCRIPTION OF THE DRAWINGS

The invention is explained in the following description in view of the drawings that show.

DETAILED DESCRIPTION OF THE INVENTION

The terms "feature," "feature point" or "feature location" are used herein to include any identifiable or distinguishable geometric element associated with an object or in a scene, and that can be seen in a photograph, such as but not limited to, an edge, portion, section, flaw, crack, line, joint, area, region, diameter, perimeter, circumference, boundary, contour, etc. Such features can be marked and measured.

The term "marker" is used herein to include any type of visible or digital information indicative of a point or location along an extent of a feature. For example, both a symbol on a computer display screen and digital information used by the computer to form the symbol may be considered markers.

The term "control point" is used herein to include a known location in space with known X and Y coordinate values (for a two-dimensional object) or known X, Y and Z coordinate values (for a three-dimensional object). Control points can be used to define a coordinate system from which dimensional information can be obtained.

It is to be understood that the present invention may be implemented in various forms of hardware, software, firmware, special purpose processors, or a combination thereof. In one embodiment the present invention may be implemented in software as an application program tangibly embodied on a non-transitory program storage device. The application program may be uploaded to and executed by a machine comprising any suitable architecture. It is to be further understood that because some of the constituent system components and method steps depicted in the present application may be implemented in software, the actual connections between the system components (or the process steps) may differ depending upon the manner in which a program is written and structures according to the present invention. Given the teachings of the present invention provided herein, one of ordinary skill in the related art will be able to contemplate these and similar implementations or configurations of the present invention.

It will be further appreciated that the functionality of the present invention may also be implemented using discrete hardware components, one or more application specific integrated circuits (ASICs), or a programmed digital signal processor or microcontroller.

The "step-by-step process" for performing the claimed functions herein is a specific algorithm as described herein as prose and/or in a flow chart. The instructions of the software program create a special purpose machine for carrying out the particular algorithm.

A general purpose computer, or microprocessor, may be programmed to carry out the algorithm/steps of the present invention creating a new machine. The general purpose computer becomes a special purpose computer once it is programmed to perform particular functions pursuant to instructions from program software that embodies the present invention. The instructions of the software program that carry out the algorithm/steps electrically change the general purpose computer by creating electrical paths within the device. These electrical paths create a special purpose machine for carrying out the particular algorithm/steps.

Unless specifically stated otherwise as apparent from the discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
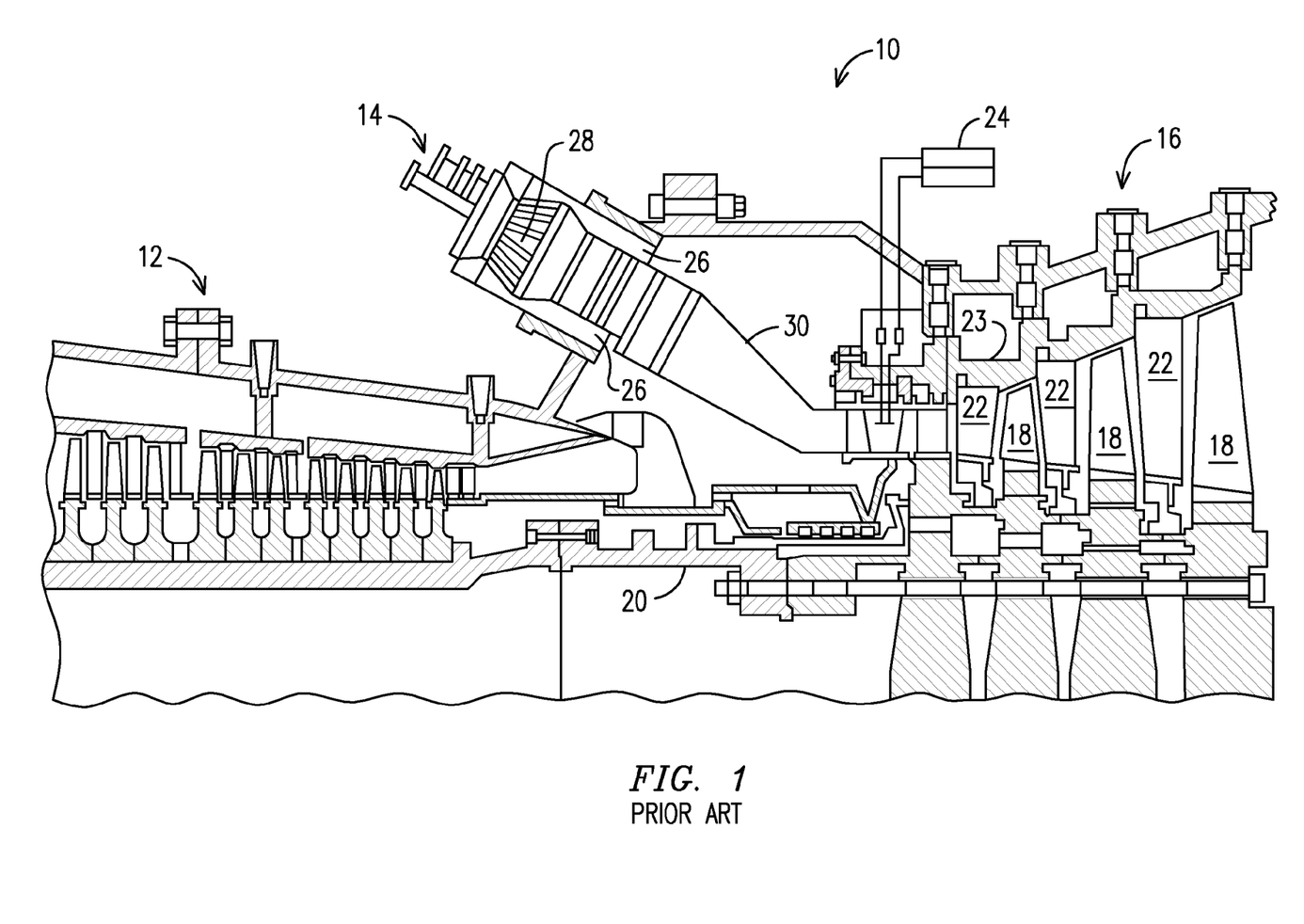
FIG. 1 is a cross-sectional illustration of a prior art gas turbine suitable for use with the present invention.

FIG. 1 illustrates a cross section of a combustion turbine 10, including a compressor 12, at least one combustor 14, and a turbine section 16. Typically, a plurality of combustors 14 is disposed in a circular arc around the turbine shaft. The turbine section 16 includes a plurality of rotating blades 18 secured to a rotatable central shaft 20. A plurality of stationary vanes 22 is positioned upstream of the rotating blades 18, and are secured to a turbine cylinder wall surfaces 23. The vanes 22 are dimensioned and configured to guide the working gas over the rotating blades 18.

In operation, air is drawn in through the compressor 12 where it is compressed and driven toward the combustor 14. The compressed air enters the combustor through an air intake 26. From the air intake 26, the air typically enters the combustor at a combustor entrance 28 where it is mixed with fuel. The combustor 14 ignites the fuel/air mixture to create the working gas. The working gas is typically at a temperature of between about 2,500 degrees F. and about 2,900 degrees F. (or between about 1,371 degrees C. and 1,593 degrees C.). The working gas exits the combustor 14 and expands through a transition member 30 then through the turbine 16, being guided by the vanes 22 to drive the rotating blades 18. As the gas passes through the turbine 16, it rotates the blades 18 which, in turn, drive the shaft 20, thereby transmitting usable mechanical work through the shaft 20. The shaft 20 also turns a compressor shaft (not shown) to compress the input air.

The combustion turbine 10 also includes a cooling system 24 dimensioned and configured to supply a coolant, for example, steam or compressed air, to internally cool the blades 18, the vanes 22, and other turbine components.

Figure 2:
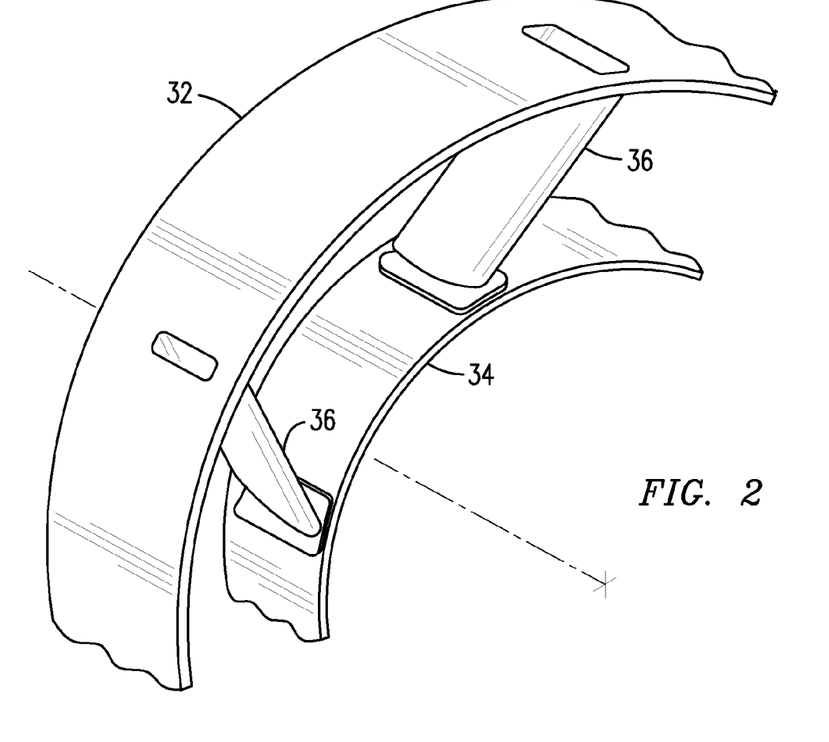
FIG. 2 is a perspective illustration of an exhaust gas case of a gas turbine.

The exhaust case is positioned downstream of the last row of rotating blade 18 shown in FIG. 1. A perspective view of a partial section of the exhaust gas case is illustrated in FIG. 2, which shows spaced-apart respective inner and outer rings 32 and 34 and a plurality of fairings 36 disposed between the inner and outer rings 32 and 34. A support strut is disposed within each fairing (and thus not visible in FIG. 2) for concentrically supporting the inner and outer rings 32 and 34. The fairings 36, preferably fabricated of a sheet metal type material, are aerodynamically shaped to present a low drag surface to direct the hot exhaust fluid away from the encapsulated support strut. With this arrangement it is not necessary for the encapsulated support struts to be made from a high-temperature material. Cooling air from the cooling system 24 is directed to cool the structures present in the exhaust case.

Figure 3:
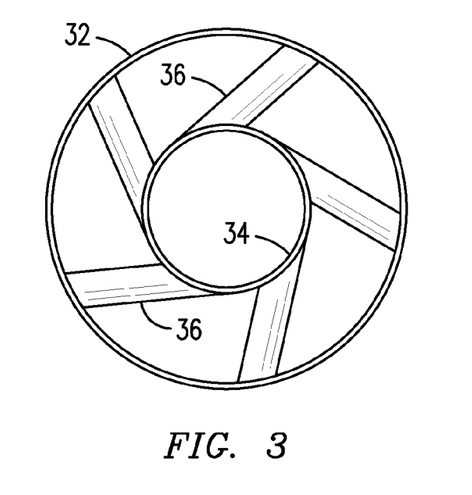
FIG. 3 is an illustration of a first arrangement of inner and outer rings and intermediate support strut fairings of the exhaust gas case of FIG. 2.

FIG. 3 illustrates a rear view of the exhaust gas case depicting the fairings 36 extending tangentially from the inner ring 34 to the outward ring 32. The fairings 36 are attached at each end to the corresponding ring. It should be appreciated that alternate means of attachment of the fairings to the rings can be employed, e.g., bolting. The struts within each fairing 36 extend through the rings 32 and 34 and are connected at the outward ends to the turbine cylinder wall surface 23 and at the inward ends to the bearing housing (not shown) that rotatably supports the turbine shaft 20.

Figure 4:
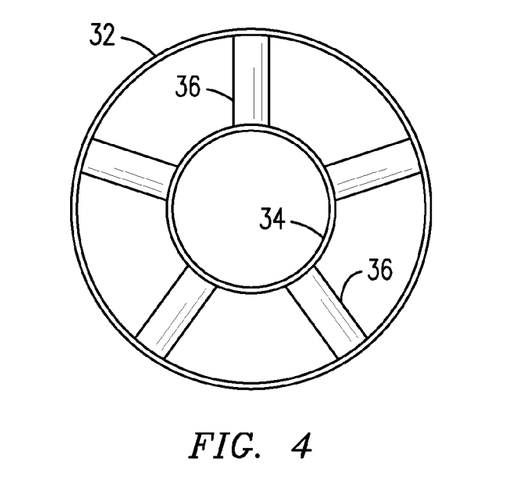
FIG. 4 is an illustration of a second arrangement of inner and outer rings and intermediate support strut fairings of the exhaust gas case of FIG. 2.

FIG. 4 shows an alternate embodiment in which the fairings 36 (and thus the encapsulated support struts) extend radially between the outer ring 32 and the inner ring 34.

The durability of the connection joints of the strut shield has been improved by employing a collared load flange. This improvement is especially advantageous if the collared load flange is custom fabricated to fit the precise contour of each strut shield where the lower edge of the strut shield is attached to a first collared flange and the upper edge is attached to a second collared load flange. A precise fit here is desired to prevent hot exhaust gasses from penetrating through this joint and reaching the support strut within the strut shield.

According to the present invention, the contour (i.e., perimeter) of the lower and upper edge of each strut shield is accurately determined and recorded. The contour shapes are also referred to as target shapes herein. Accurate determination of the shape is particularly useful when replacing a strut shield as a maintenance item for operational engine.

As will be described more fully below with regard to FIG. 5, each target shape is captured by placing a material sheet at the lower (and upper) edge of the shield and then drawing a marking instrument around the contour (i.e., perimeter) of the shield to scribe a line on the material sheet. A photographic method then converts the scribed line that represents the strut shield contour to a digital format and thus to a digital file to allow the target shape to be manipulated and edited using conventional CAD tools. Reducing the target shape to a digital format also permits digital storage of the target shape and facilitates transmittal of the target shape to a vendor for fabrication of the replacement component.

In the described application, the target shape represents the perimeter of either a lower or upper edge of the strut shield as described above. Also in the described embodiment, the perimeter is a closed curve. However, the teachings of the present invention can be applied to a target shape defined by any curve, whether open or closed, to any shape, and to any target shape (region) of any component for which it is desired to create a template. As described herein, the component template (i.e., the target shape) may be used for fabricating a replacement for the component or for fabricating another component that interfaces with or operates in conjunction with the component.

Figure 5:
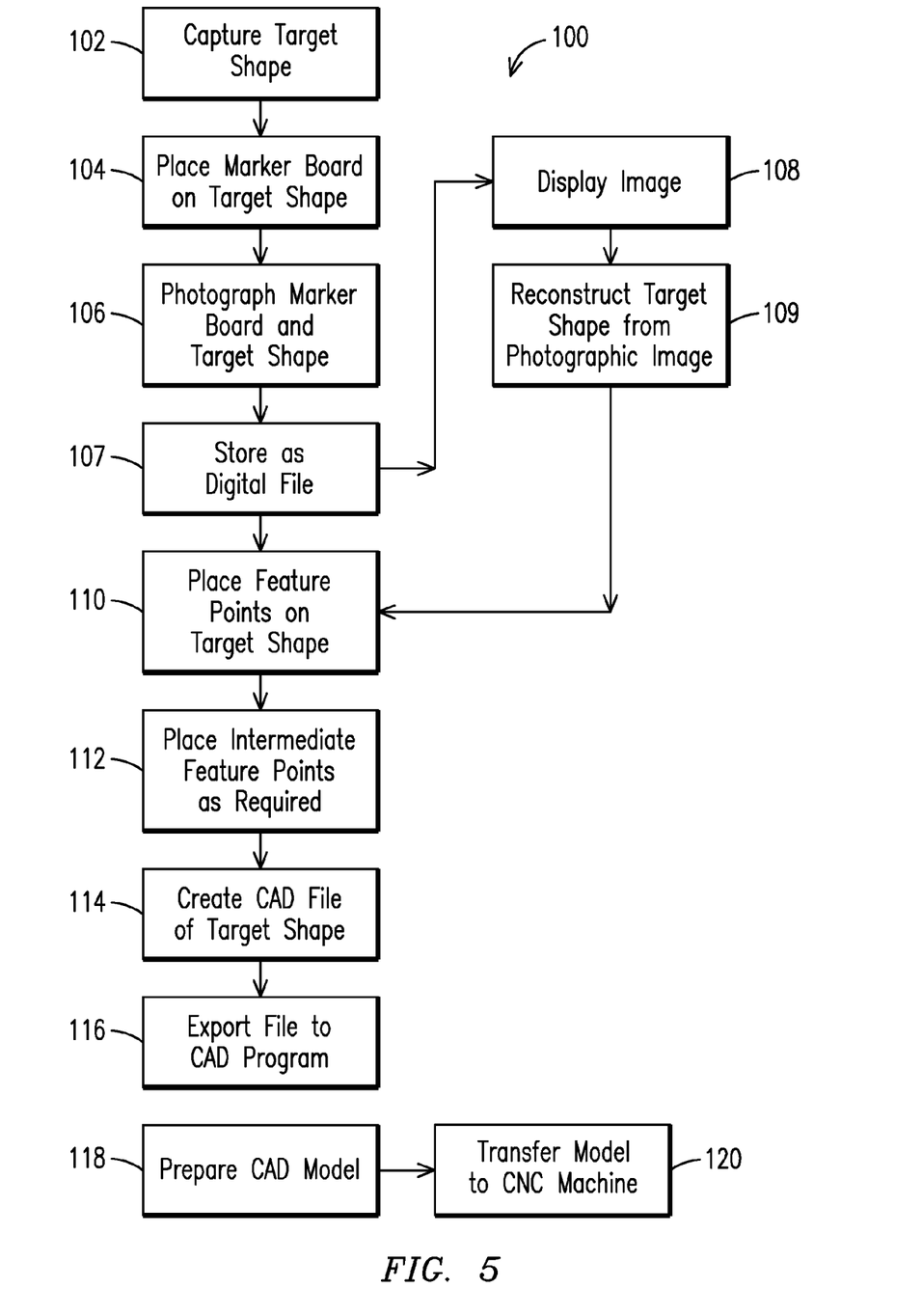
FIG. 5 is a flow chart depicting the various steps associated with embodiments of the present invention.

With reference to the flow chart 100 of FIG. 5, at a step 102 the target shape of a first component (or a target shape of a region of the first component) is captured to create a template of the target shape. The template may be used to fabricate a second component that mates with the first component along an interface that includes the target shape. Alternatively the template may be used to fabricate a replacement for the first component. In one application the target shape comprises a lower edge of the strut shield for use in fabricating any components that interface with this lower edge.

The capturing process can be accomplished by any one of several different techniques. For example, the target shape may be placed over a material sheet having a painted surface. The user follows the target shape outline (contour or perimeter) with a sharp marking instrument to etch or scribe a curve in the painted surface.

In another embodiment the material sheet is covered with a coating such as Dykem Blue spray paint coating available from ITW Dymon of Olathe, Kans. In this embodiment the user employs the marking instrument to etch or mark the target shape outline in the Dykem Blue coating.

The user can also scribe a desired shape free hand in the painted or coated material sheet without the benefit of a target shape.

The target shape can also be captured by placing the target shape on a material sheet and painting the target shape, extending the paint onto the material sheet. When the target shape is removed, an outline of the target shape is present on the material sheet.

In addition to a sharp object, a pen, pencil or marker can be used as the scribing instrument. Any instrument that etches the coating on the material sheet or leaves a mark on the material sheet or on a coating of the material sheet is satisfactory. It is only necessary for the target shape (or a plurality of points that represent the target shape) to be visible in a subsequently exposed photograph.

In another embodiment, a dividers instrument can be used. One point of the dividers is placed against a point on the component edge and the other point is used to scribe a point on the material sheet or a coating of the material sheet at an offset distance from the component edge. The process continues along an entire perimeter of the component (or as much of the perimeter as can be easily accessed), capturing a plurality of points for the target shape. In this embodiment the offset distance (i.e., the distance between the component contour and the target shape contour) must be known and later accounted for when fabricating the replacement component.

Figure 6:
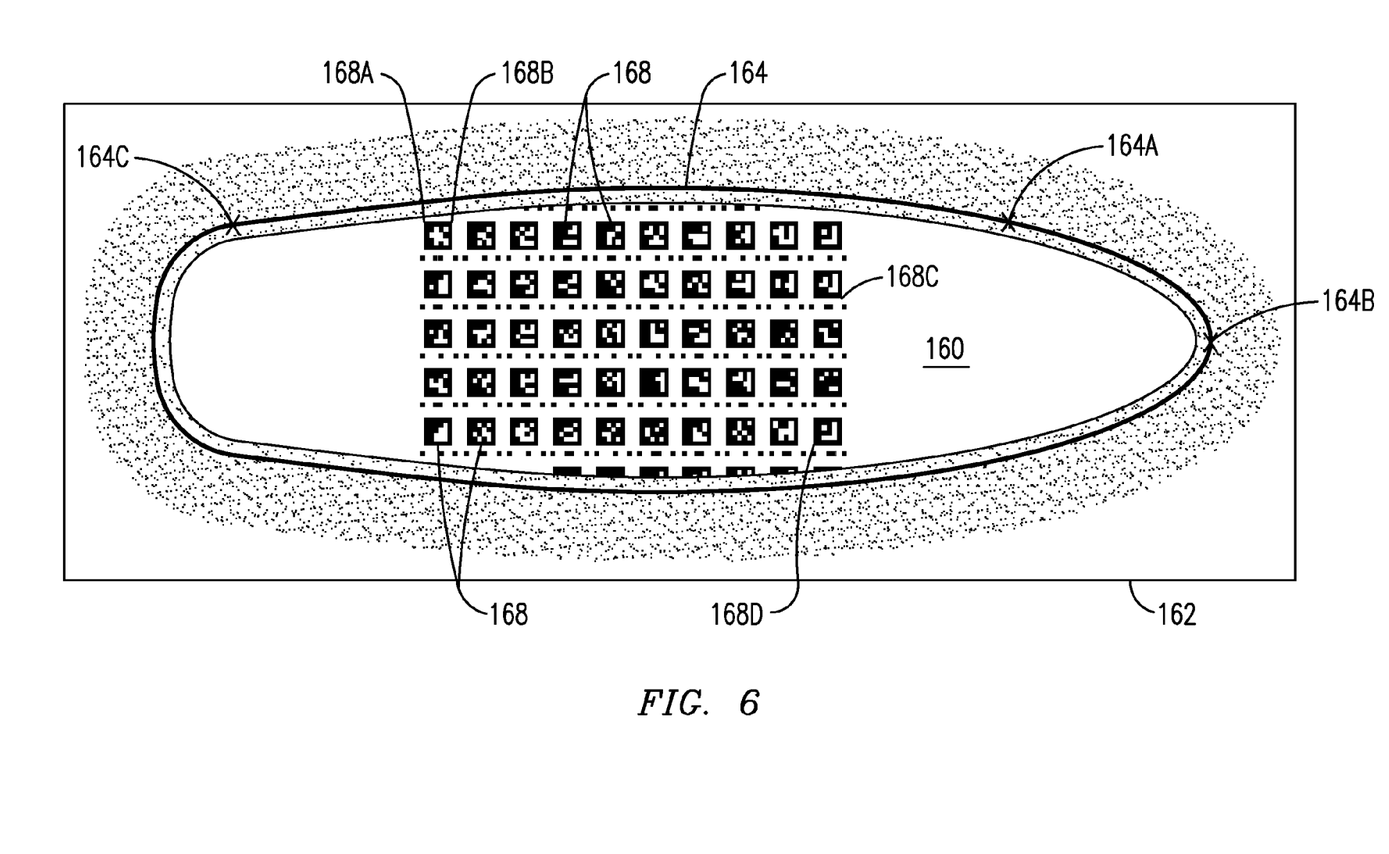
FIG. 6 represents a photographic image of a template and marker board according to an embodiment of the present invention.

At a step 104 of FIG. 5, the user places a marker board in or around a planar representation of the target shape. See FIG. 6 illustrating a marker board 160 on a substrate 162 within a target shape line 164 that has been generated according to one of the techniques described above. To prevent distortions in a later photograph of the marker board 160 and the target shape or line 164 (i.e., at a step 106) both the marker board 160 and the substrate 162 should preferably be planar.

The marker board 160 comprises a plurality of visible markers 168 from which an X-Y coordinate system can be created. Although the markers 168 are depicted as squares, any polygonal shape can be used. Also, dimensions between exemplary feature points 164A, 164B, 164C on the target shape line 164 can be determined. Corners of the markers 168 serve as control points for creating this coordinate system and for determining these dimensions. For example, corners 168A, 168B, 168C and 168D are exemplary control points. By determining a coordinate system and dimensions the target shape can be completely described for use in fabricating an object with the target shape or an object that interfaces with the target shape.

In the marker board 160 the markers 168 are arranged in a checkerboard pattern although this pattern is not required. The marker board 160 should include a sufficient number of markers 168 (and thus control points) to create an accurate representation of the target shape. This number is dependent on the shape of the target shape, whether the target shape is two-dimensional or three dimensional, etc.

The patterns within each marker 168 and the codes below each marker 168 uniquely identify the marker. Other marker boards that offer the same properties, i.e., control point locations with known X-Y coordinates and dimensions, can be used in lieu of the marker board 160. For the present application, a marker board having at least three control point locations is required. Of course, additional control point locations provide additional accuracy. The illustrated marker board 160 with its regular grid is a simple exemplary marker board that satisfies these requirements.

As illustrated in FIG. 6 certain of the markers 168 are occluded. This does not present a problem during the process so long as there are a sufficient number of other makers 168 to accurately determine the geometric shape and dimensions of the target shape.

At a step 106 a photograph of the target shape line 164 and the marker board 160 is taken. If necessary, more than one photograph can be taken and the photographs registered to show the entire target shape and a portion of the marker board 160. When capturing multiple images the captured regions may be overlapped to simplify registering the individual images to form a complete photograph of the target shape. It is not necessary, however, to overlap the images if the images can be properly registered to illustrate the target shape, i.e., if the registration can be accomplished using the markers 168. However, it is important that the entire target shape line 164 that is being modeled (measured) is visible when all the images are used to form the complete target shape.

Any camera can be used to take the photographs as image quality is not of paramount importance. It is only critical that the target shape line 164 and the marker board 160 with its control points appear in the photograph. Even a smart phone camera can be used to capture the images. However, a higher resolution photograph allows capturing of a more accurate template and thus fabrication of a more accurate component.

The image of the target shape and the marker board is then stored as a digital file at a step 107 for use during subsequent processing steps. At a step 108 the image is displayed.

A method referred to as reconstruction (a branch of the field of photogrammetry) is used to determine geometric properties of the target shape line 164 from the photographic image, specifically the geometric properties of feature points on the target shape line 164. See a step 109 of FIG. 5.

Generally, reconstruction involves the creation of a metric (i.e., a known scale of the image) of a two or three dimensional representation of an object from the image or images of that object. For example, a distance between two points (i.e., two feature points) that lie on a plane parallel to the photographic image plane of the camera (thereby avoiding the calculation complexities and potential measurement errors associated with converting a two dimensional image to a three dimensional model) can be determined by measuring that distance on the image if the scale of the image is known. Note that the scale along an X axis may differ from the scale along a Y axis; both can be determined according to the present invention. The actual distance between the two feature points is then determined by multiplying the distance measured in the image by the reciprocal of the scale.

To determine the scale of the image, the image must include a known object (i.e., control points) with known dimensions. The marker board 160 with the markers 168 and the control points 168A, 168B, 168C and 168D satisfies this requirement.

The reconstruction process also involves correcting image distortion caused by camera optics. Without this image distortion correction, errors are introduced in the representation of the target shape. Known algorithms can be used to correct this distortion by inputting the image parameters to the distortion correction algorithm and supplying undistorted image parameters as the output. After the camera optics distortions have been removed, the reconstruction process continues by determining the geometric properties of the target shape line 164 from the distortion-corrected photographic image.

As applied to the present invention, the image includes a known object, i.e., the marker board 160, with the markers 168 (and therefore the control points 168A, 168B, etc.) that have known dimensions and known locations relative to the other markers 168. Thus the markers 168 and the control points form an X-Y coordinate system for use with the target shape line 164. The scale of the image can be determined from these markers and control points.

The determined scale can be applied to any two feature points (i.e., points on the image) of the target shape line 164 to determine the location of the feature points with respect to a control point on the marker board 160 or with respect to the X-Y reference coordinate system. The distance between those two feature points in the metric representation of the target shape can then be determined.

The reconstruction process of the step 109 continues until all significant feature points and dimensions have been determined for the target shape by associating one or more control points with the feature points. For example, it is especially critical to determine these locations and dimensions for curved segments of the target shape.

To completely describe the target shape, it is necessary to identify a sufficient number of feature points on that target shape and/or on a perimeter of the target shape. These feature points can be captured during the reconstruction process automatically or manually identified by the user. The reconstruction software can employ a line or edge detection algorithm, for example, that detects an outline of the target shape and places a plurality of feature points on that outline. As applied to the present application feature points are placed either automatically or manually on the target shape line 164.

For manual placement of feature points, the target shape image is displayed and the user manually mouse clicks on the target shape perimeter to place a feature point. The reconstruction software captures the location of each mouse click and places a feature point at that location. A step 110 of the flow chart 100 represents this process.

The density of captured feature points along a curved segment of the target shape image may be greater than along a linear segment of the target shape. The higher density of captured feature points ensures a more accurate final template image.

Some segments of the target shape may not be captured with a sufficient number of feature points to adequately and accurately capture an important target shape feature. For example, the scribed line representing the template of the target shape captured at the step 102 may not be sufficiently visible along some segments to accurately place an adequate number of feature points along that segment. Or there may be two spaced-apart scribed lines along some segments resulting from the user scribing twice along the template to form a sufficiently visible line, but failing to place the second scribed line directly over the first scribed line. Under these conditions, the reconstruction software can automatically determine one or more intermediate feature points between two existing feature points, where the two existing feature points are not sufficiently closely spaced to capture an accurate target shape curve segment. Placement of these intermediate points is set forth in step 112 of FIG. 5.

To determine a location of an intermediate feature point the program interpolates between the locations of the two existing feature points. It is especially critical that the software accurately place intermediate feature points along curved segments of the target shape feature to accurately capture the curve shape. A spline interpolation or polynomial interpolation algorithm may be used to determine the location of such intermediate feature points.

Whenever the software places an intermediate feature point, the user may first be first presented with a candidate location for the intermediate feature point. The user can determine whether the intermediate feature point is placed correctly relative to the target shape feature and move the intermediate feature point to a more accurate location if desired or accept the intermediate location as placed by the reconstruction software.

To further simplify the analysis, it is assumed that the substrate 162 and the marker board 160 are planar, thus avoiding three-dimensional calculations and its attendant complexities. However, such an assumption is not required according to the present invention.

In addition to correcting optical distortions as described above, the present invention can also correct other distortions (e.g., radial or tangential distortions) in the feature points that are automatically placed by the reconstruction software and in the feature points that are manually placed by the user.

Like the optical distortions, these distortions can be automatically determined and measured by the software using the marker board, and in particular the marker board squares (which form grid columns and rows in the marker board). For example, if there is no radial distortion the grid columns and rows will lie on a straight line along each grid column and row. In one embodiment the algorithm of the present invention determines such distortions, and if the distortions are above a user-defined threshold the algorithm makes the necessary corrections to correct the distortions.

After the reconstruction process is complete, at a step 114 the target shape representation is converted to a digital CAD file format suitable for use with a CAD program or another computer-aided drawing program.

At a step 116 the CAD file is exported to a CAD software program, e.g., AUTOCAD software. The software can also create files for use with other CAD programs.

The CAD file may be electronically transferred to a vendor for fabrication of an object embodying the target shape or of an object that interfaces with the target shape. The present invention obviates the need to send a physical template of the target shape to a vendor as was necessary according to the prior art.

At a step 118 a CAD model of the object embodying the target shape or an object that interfaces with the target shape is created.

An object incorporating the target shape is fabricated by transferring the CAD model to a CNC machine (i.e., a computerized numerically controlled machine) at a step 120.

Although the present invention has been described with reference to a two dimensional shape, the teachings of the present invention can be easily extended to a three dimensional shape for fabricating a three dimensional object. In the three dimensional case multiple images from different viewpoints that each show the same part are required. The minimum number of images required is two, i.e., the same image from two cameras at different locations. In this case object depth is measured using the parallax (difference between the camera centers) between the two cameras.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

The invention claimed is:

1. A method comprising:
   obtaining a digital image of at least a portion of a first object including a first feature, the image further including a visible marker indicative of one or more control points arranged to define a coordinate system, wherein the visible marker comprises a marker board including a grid indicative of known locations and known dimensions;
   displaying the image including the first feature and the visible marker on a display device;
   associating one or more of the control points with feature points along an extent of the displayed first feature,
   including a scale in the image from which a scale of the first feature along an X axis and a scale of the first feature along a Y axis can be determined, and using the scale to provide dimensional information for the feature points; and
   using the associated one or more control points to create a data file corresponding to the first feature, the data file comprising geometric properties of the feature points.

2. The method of claim 1, wherein the first feature comprises one of a two-dimensional first feature and a three-dimensional first feature.

3. The method of claim 1, wherein the step of associating one or more of the control points with feature points along an extent of the displayed first feature further comprises:
   moving a cursor on the display device to mark a first feature point along the extent of the first feature; and
   associating one or more control points with the first feature point and associating one or more control points with each one of a remainder of feature points.

4. The method of claim 1, further comprising a step of correcting distortion in the digital image.

5. The method of claim 1, wherein the grid comprises a plurality of polygons and wherein the control points comprise corners of one or more of the polygons.

6. The method of claim 1, further comprising using the data file to manufacture a second object containing a second feature, wherein the second feature interfaces with the first feature.

7. The method of claim 1, wherein the first object comprises a strut shield and the first feature comprises a contour of the strut shield along an edge thereof.

8. The method of claim 1, applied to the manufacturing of a replacement part for an in-service machine, the method further comprising:
   using the digital file to fabricate the replacement part comprising a second feature for interfacing with the first feature.

9. The method of claim 1, wherein the first object comprises a template for use in fabricating a replacement part and the first feature is a shape of the first object, the method further comprising:
   placing the template proximate the scale;
   obtaining the digital image to include the template and the scale; and
   using the digital data file to manufacture the replacement part having a shape corresponding to the first feature.

10. The method of claim 9, wherein the template comprises a curve indicated on a substrate.

11. The method of claim 10, wherein the curve represents an edge of a strut shield.

12. The method of claim 1, applied to the manufacturing of a replacement part for an in-service machine, the method further comprising:
   obtaining the digital image of the first feature to be used to form a shape of the replacement part; and
   using the digital data file to manufacture the replacement part, a portion of the replacement part having a shape corresponding to the shape of the first feature.

13. The method of claim 1, applied to the manufacturing of a replacement part for an in-service machine, the method further comprising:
   making a template useful to manufacture the replacement part, wherein the first feature comprises a cross-sectional shape of the first object;
   obtaining the image to include the template and the scale; and
   using the digital data file to manufacture the replacement part having a second feature corresponding to the first feature.

14. A method comprising:
   creating a template with a shape corresponding to a shape of a portion of a part to be replaced in an in-service machine, the template comprising a marking on a surface;
   obtaining a digital image including the template and further including a visible marker indicative of one or more control points arranged to define a coordinate system, wherein the visible marker comprises a marker board including a grid indicative of known locations and known dimensions;
   displaying the digital image including the template and the visible marker on a display of a computing machine;
   using the computing machine to locate a plurality of feature points along an extent of the template, and to perform a spatial association of the plurality of feature points relative to the one or more control points, the spatial association corresponding to the shape of a portion of the part to be replaced;
   including a scale in the image from which a scale along an X axis corresponding to the portion of the part to be replaced and a scale along a Y axis corresponding to the portion of the part to be replaced can be determined, and using the scale in the image to provide dimensional information for the feature points;
   producing a digital data file corresponding to a spatial orientation of the plurality of feature points; and
   manufacturing the replacement part using the digital data file and without using the template.

15. A method comprising:
   loading a storage device with instructions and a digital image of at least a portion of a first object including a first feature, the digital image further including a visible marker board including one or more control points indicative of known locations and known dimensions;
   executing the instructions in a processor to perform acts comprising:
      displaying the image including the first feature on a display device, the image further including the visible marker board with the one or more control points indicative of known locations and of known dimensions;
      associating one or more of the control points with feature points along an extent of the displayed first feature;
      including a scale in the image from which a scale of the first feature along an X axis and a scale of the first feature along a Y axis can be determined and using the scale to provide dimensional information for the feature points; and using the associated one or more control points to create a digital data file corresponding to the first feature, the digital file comprising geometric properties of the feature points.

16. The method of claim 15, further comprising:

wherein the marker board comprises a plurality of polygons and wherein the control points comprise corners of one or more of the polygons; and using the X axis scale and the Y axis scale to determine the geometric properties of the feature points.

17. The method of claim 15, further comprising using the digital data file to manufacture a second object containing a second feature, wherein the second feature interfaces with the first feature, or to manufacture a replacement object for replacing the first object.

* * * * *